United States Patent [19]

Pelzl et al.

[11] Patent Number: 4,884,975

[45] Date of Patent: Dec. 5, 1989

[54] CENTERING STRIP FOR USE WITH A BACKPLANE PRINTED CIRCUIT BOARD

[75] Inventors: Leo Pelzl, Holzkirchen; Peter Seidel, Grobenzell; Karl Zell, Niederpocking, all of Fed. Rep. of Germany

[73] Assignee: Siemens Aktiengesellschaft, Berlin and Munich, Fed. Rep. of Germany

[21] Appl. No.: 13,566

[22] Filed: Feb. 11, 1987

[30] Foreign Application Priority Data

Mar. 27, 1986 [DE] Fed. Rep. of Germany ....... 3610418

[51] Int. Cl.$^4$ ...................... H01R 13/64; H01R 23/68
[52] U.S. Cl. ........................................ 439/78; 439/681
[58] Field of Search .............................. 439/55, 78–84, 439/571, 572, 680, 681

[56] References Cited

U.S. PATENT DOCUMENTS 3,299,392  1/1967  Evans .................................. 439/681
4,674,812  6/1987  Thom et al. ........................... 439/78

FOREIGN PATENT DOCUMENTS 0123590  4/1984  European Pat. Off. .
607542  12/1978  Switzerland .

Primary Examiner—Neil Abrams
Attorney, Agent, or Firm—Hill, Van Santen, Steadman & Simpson

[57] ABSTRACT

A centering strip for plugging onto a backplane printed circuit board provided with contact blades accepts plugs in a housing opening and accepts contact blades through openings in a floor of the centering strip. In order to guarantee that the individual cable plugs are correctly plugged into the proper location on the centering strip and that the centering strip is not damaged when the plug is inserted into the housing opening, the centering strip is divided into a plurality of segments by transversely oriented partitions. The partitions have two sides on an upper half portion which forms a mechanical coding devices for the plugs to be accepted. The lower half of the partitions are provided with cavities for acceptance of contact blades. The depth of the cavities is dimensioned such that the centering strip is supported on the contact blades by a solid middle part located between the upper and lower half portions of the partitions.

6 Claims, 3 Drawing Sheets

CENTERING STRIP FOR USE WITH A BACKPLANE PRINTED CIRCUIT BOARD

BACKGROUND OF THE INVENTION

1. Field of the Invention

This invention relates generally to a centering strip for plugging onto a backplane printed circuit board, and in particular, to a centering strip having a housing opening on one side for acceptance of plugs and also having for the acceptance of contact blades through openings in a floor of the centering strip.

2. DESCRIPTION OF THE PRIOR ART

It is known to provide ends of centering strips with flanges in order to secure the centering strips to sub-racks by means of these flanges. When the centering strips serve, for example, for the acceptance of one or more cable plugs, considerable pressure forces may occur when the cable plugs are plugged into the centering strip. This can lead to damage of the centering strip or to individual contact blades. This problem particularly arises when cable plugs must be plugged into the middle part of the centering strip. Another problem occurs when cable plugs do not extend over the full length of the centering strip. Since backplane printed circuit boards are equipped with a continuous series of contact blades, it is possible that the cable plugs may be plugged into an incorrect section of the centering strip.

Typical examples of prior art backplane printed circuit boards having contact blades and cable plugs are disclosed in Swiss Patent No. 607,542 and European published patent application 0,123,590, herein incorporated by reference. FIG. 1 of the Swiss patent shows the contact blades as element 11 in FIG. 1. The European published patent application in FIG. 9 shows a typical cable plug having keys 14.

SUMMARY OF THE INVENTION

It is an object of the present invention to provide a centering strip in which damage to the centering strip is avoided when cable plugs are plugged into it. Also, the novel centering strip has the further advantage that an incorrect cable plug is prevented from being plugged in.

The centering strip of the present invention is divided into a plurality of segments by transversely oriented partitions. Each of the partitions has a lower half portion and an upper half portion. The lower half portion of each partition is provided with a cavity for the acceptance of contact blades. Furthermore, two sides of the upper half portion of the partitions comprise a mechanical coding device for the cable plugs to be accepted by the centering strip. The upper and lower half portions of the partitions are separated from one another by a middle part extending over the maximum width of the partitions. Depths of the cavities in the lower half portion of the partitions are dimensioned such that the centering strip is supported on the contact blades with the middle parts of the partitions.

The centering strip of the present invention permits plugging onto a backplane printed circuit board which is equipped with contact blades. The centering strip is supported in the region of the partitions on the contact blades present there. This provides for the pressure forces generated when plugging cable plugs onto the centering strip to be distributed onto a greater plurality of contact blades. This has the advantage that when plugging cable plugs in the middle part of the centering strip, a sag of the centering strip is prevented. Since the contact blades which project into the lower halves of the partitions are not used for an electrical tap, the upper halves of the partitions are provided with mechanical coding devices for mating with the cable plugs to be accepted. As a result, the use of the partitions increases both the stability of the centering strip when plugging cable plugs into it, as well as, preventing a possible incorrect plug from being plugged into the centering strip.

Furthermore, the centering strip of the present invention has a positive locking support mount fashioned as a slot within a wall located at a predetermined distance within the cavities of the lower half portion of the partitions per contact blade to be accepted. The stability of the centering strip is thereby further increased, since the torsional force of the contact blades is utilized for counteracting the influence of any lateral forces on the centering strip.

The mechanical coding devices of the centering strip are composed of a plurality of webs orientated perpendicularly thereto. The webs have the feature that the width of the webs decreases towards the partition. This design of the webs has the advantage that the centering strip can be manufactured with the maximum number of possible webs and that one or more webs can be easily removed with a simple tool depending on the need and format of the required coding with the cable plug.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, the several figures of which like reference numerals identify like elements, and in which:

DESCRIPTION OF THE PREFERRED EMBODIMENT

Figure 1:
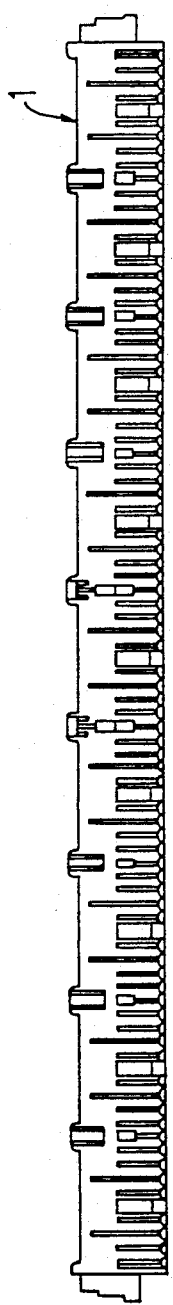
FIG. 1 is a side-view of a centering strip embodying the present invention.
Figure 2:
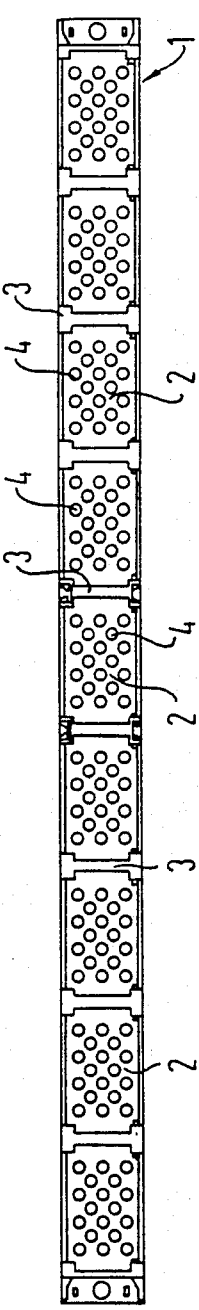
FIG. 2 is a plan view of the FIG. 1 centering strip.

FIGS. 1 and 2 show two views of the overall structure of the novel centering strip 1. In the description of these two figures, as well as, in the description of the remaining figures, only those structural features of the centering strip crucial to an understanding of the present invention shall be described. The centering strip 1 is sub-divided into individual segments 2 which are respectively separated from one another by partitions 3. Openings 4 in a floor of the centering strip 1 are provided for receiving some of the contact blades of a backplane printed circuit board. The geometrical arrangement of the openings 4 corresponds to the geometrical arrangement of the contact blades on the backplane printed circuit board.

Figure 3:
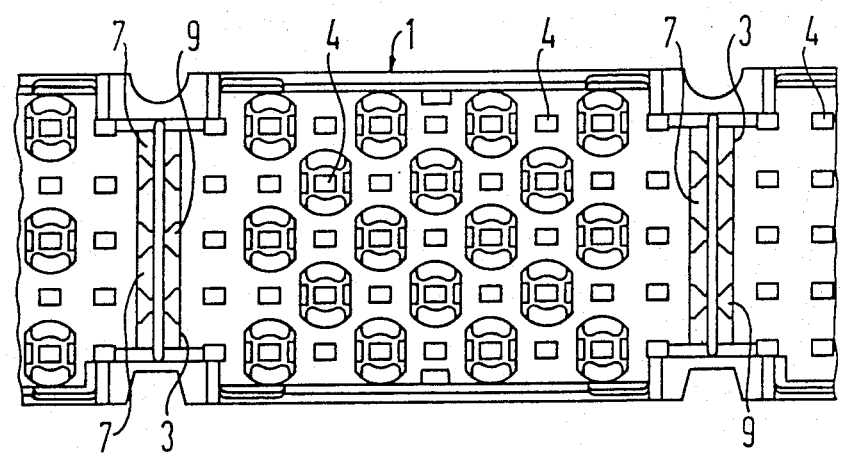
FIG. 3 is a detailed partial plan view of the centering strip shown in FIG. 2.
Figure 4:
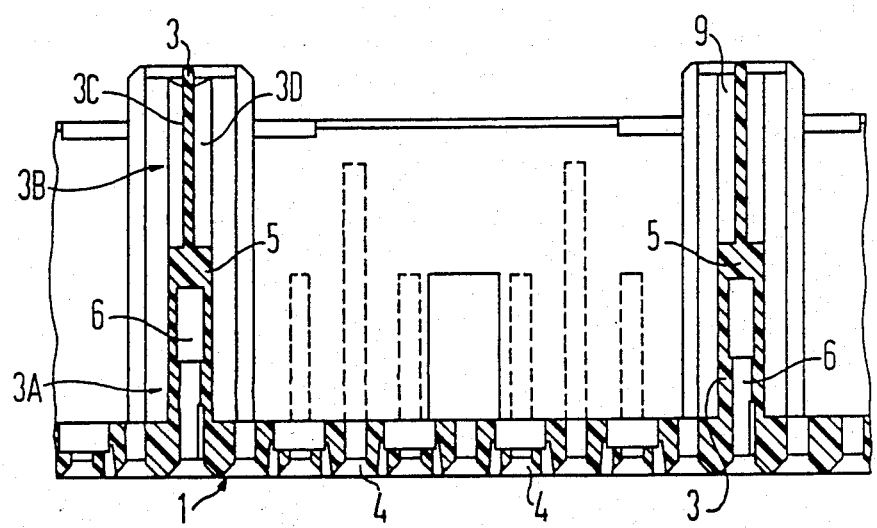
FIG. 4 is a partial section view along the longitudinal axis of the centering strip corresponding to the plan view in FIG. 3.
Figure 5:
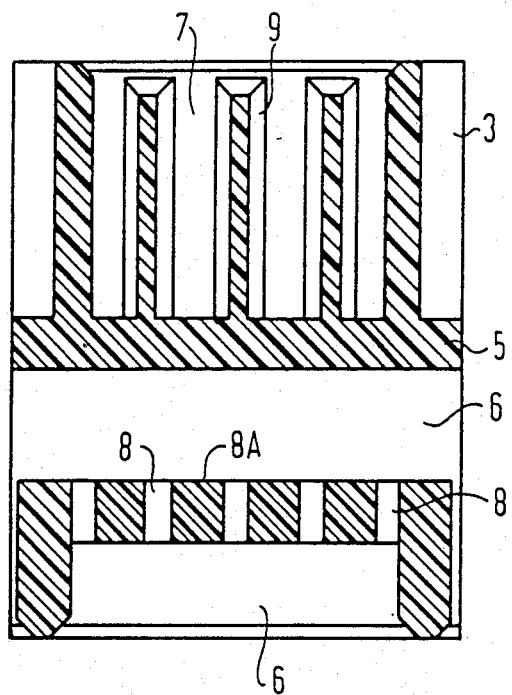
FIG. 5 is a cross-sectional view through the centering strip shown in FIG. 4 along the line I-II.

The partitions 3 of the centering strip shall now be set forth in greater detail. The detailed structure of the partitions 3 is shown in FIGS. 3, 4 and 5.

Each partition 3 is composed of a lower half portion 3A for the acceptance of contact blades and an upper half portion 3B which forms a mechanical coding device 7. The two halves 3A and 3B are separated from one another by a solid middle aart 5 which extends over the maximum width of the partition 3. The lower half 3A of each of the partitions 3 contains a cavity 6. The overall depth of the cavity 6 is dimensioned such that, when inserting cable plugs, the centering strip 1 is supported on the contact blades with the underside of the middle part 5 of the partitions 3. As a result thereof, the pressure forces generated during plugging are uniformly distributed onto a plurality of contact blades and damage to the centering strip due to sagging is prevented.

Positive locking mounts for the individual contact blades is fashioned as slots 8 in a wall 8A which is provided roughly in the middle of the cavity 6, a slot 8 being provided per contact blade to be accepted. As a result of this positive locking mount, the torsional force of the contact blades is utilized for preventing lateral forces to be exerted upon the centering strip 1, thus leading to a further stabilization of the centering strip 1. It can be appreciated that the contact blades accepted by the cavities 6 in the lower half 3A of the partitions 3 can be arranged in the same grid pattern as the other contact blades which are received by openings 4 in the contact strip 1.

The upper half of the partitions 14 have perpendicularly attached webs 9 on both sides 3C and 3D of the upper portion 3B of the partitions 3. These webs 9 form a mechanical coding means 7 for the cable plugs. Since the contact blades projecting into the cavities 6 of the partitions 3 cannot be electrically tapped, the upper half 3B of the partitions 3 can thus be utilized. In the preferred embodiment, three webs 9 are provided at each lateral surface at the upper halves 3B of the partitions 14. These webs 9 are fashioned such that their width decreases towards the partition 3. In this way, it is possible to remove individual webs 9 as needed with the assistance of a simple tool. This means that the individual codings which are to be subsequently utilized need not be taken into consideration at the time of manufacturing the centering strip 1. The actual coding can be effected by the removal of a web 9 at a location such that the particular partition 3 can engage a cable plug having a predetermined coding configuration. The insert part of the cable plug then can engage the area that the removed web 9 previously occupied. In this way, the mechanical coding device 7 prevents incorrect plugging of cable plugs in a straight-forward, simple manner. It should be realized that the individual cable plugs can extend over one or more segments 2 of the centering strip 1.

The invention is not limited to the particular details of the apparatus depicted and other modifications and applications are contemplated. Certain other changes may be made in the above described apparatus not departing from the true spirit and scope of the invention herein involved. It is intended, therefore, that the subject matter in the above depiction shall be interpreted as illustrative not in a limiting sense.

We claim:

1. A centering strip for plugging onto a backplane printed circuit board having contact blades, which are received in openings in a floor of the center strip, said center strip also having a housing opening for accepting a plug, comprising:
  a plurality of segments divided from one another by transversely oriented partitions;
  each of said partitions having a lower half portion with a cavity for acceptance of the contact blades;
  each of said partitions having an upper half portion with first and second sides forming a mechanical coding device for mating with the plug;
  solid middle part separating said upper and lower parts of each of said partitions and extending a maximum width of said partitions; and
  depth of said cavities dimensioned such that said centering strip is supported on the contact blades at substantially said solid middle part of said partition.

2. The centering strip described in claim 1, wherein said centering strip further comprises a positive-locking supprrt mount, said support mount being within said cavity in said lower half portion of said partition, said wall having a slot per contact blade to be accepted.

3. The centering strip described in claim 1, wherein each of said mechanical coding devices has a plurality of perpendicularly orientated webs.

4. The centering strip described in claim 3, wherein a width of said web decreases towards said partition.

5. A centering strip for plugging into a backplane printed circuit board and having a housing opening for accepting a plug comprising:
  a plurality of segments divided from one another by transversely oriented partitions;
  each of said partitions having a lower half portion with means for acceptance of the contact blades;
  each of said partitions having anupper half portion with means for forming a mechanical coding device for mating with the plug;
  means for physically separating said upper and lower portions of each of said partitions and extending a maximum width of said partitions;
  said means for acceptance of the contact blades in said lower half portion of said partition beoing a cavity for receiving at least one contact blade, said cavity containing a positive-locking support mount, said supporet mount being a wall located a predetermined distance within said cavity and having at least one slot per contact blade to be accepted.

6. A centering strip for plugging onto a backplane printed circuit board having contact blades and having a housing opening for accepting a plug comprising:
  a plurality of segments divided from one another by transversely oriented partitions;
  each of said partitions having a lower half portion with a cavity for acceptance of the contact blades, each of said cavities having a positive-locking support mount, said support mount being a wall located a predetermined distance within said cavity and having slots for accepting the contact blades;
  each of said partitions having an upper half portion with first and second sides, each of said first and second sides having a plurality of perpendicularly oriented webs which decrease in width toward said partition, thereby forming a mechanical coding device for mating with the plug;
  solid middle part separating said upper and lower parts of each of said partitions and extending a maximum width of said partitions; and
  depth of said cavities dimensioned such that the centering strip is supported on the contact blades at substantially said solid middle part of said partition.

* * * * *